United States Patent [19]

Meyer

[11] Patent Number: 5,107,224

[45] Date of Patent: Apr. 21, 1992

[54] WIDEBAND SINGLE-ENDED VOLTAGE-TO-CURRENT CONVERTER AND GAIN-CONTROL CIRCUIT

[75] Inventor: Robert G. Meyer, Berkeley, Calif.

[73] Assignee: North American Philips Corporation, New York, N.Y.

[21] Appl. No.: 317,116

[22] Filed: Feb. 28, 1989

Related U.S. Application Data

[63] Continuation of Ser. No. 115,136, Oct. 30, 1987, abandoned.

[51] Int. Cl.⁵ .............................................. H03F 3/68
[52] U.S. Cl. .................................. 330/147; 330/256; 330/261; 330/289; 358/184
[58] Field of Search ............... 330/125, 147, 256, 261, 330/266, 272, 289; 358/184

[56] References Cited

U.S. PATENT DOCUMENTS 4,041,409  8/1977  Kominami et al. ............ 330/261 X
4,050,030  9/1977  Russell ........................... 330/256

FOREIGN PATENT DOCUMENTS 68707   5/1980  Japan ................................. 330/289
102105  8/1981  Japan ................................. 330/261

OTHER PUBLICATIONS

Schwarz, "Offset Compensation Circuit", *IBM Technical Disclosure Bulletin*, vol. 19, No. 9, Feb. 1977, pp. 3584, 3585.

Primary Examiner—James B. Mullins
Attorney, Agent, or Firm—David R. Treacy

[57] ABSTRACT

In accordance with the teachings of this invention, a novel wide-band, DC coupled, single-ended voltage-to-current converter and gain control circuit is provided. Of importance, the circuit of this invention is designed to receive an input signal referenced to ground such that for zero input current, zero output current is provided. A replica bias circuit is used which allows the output signal to be a function of the input signal without offsets introduced by bias currents used throughout the circuit.

2 Claims, 5 Drawing Sheets

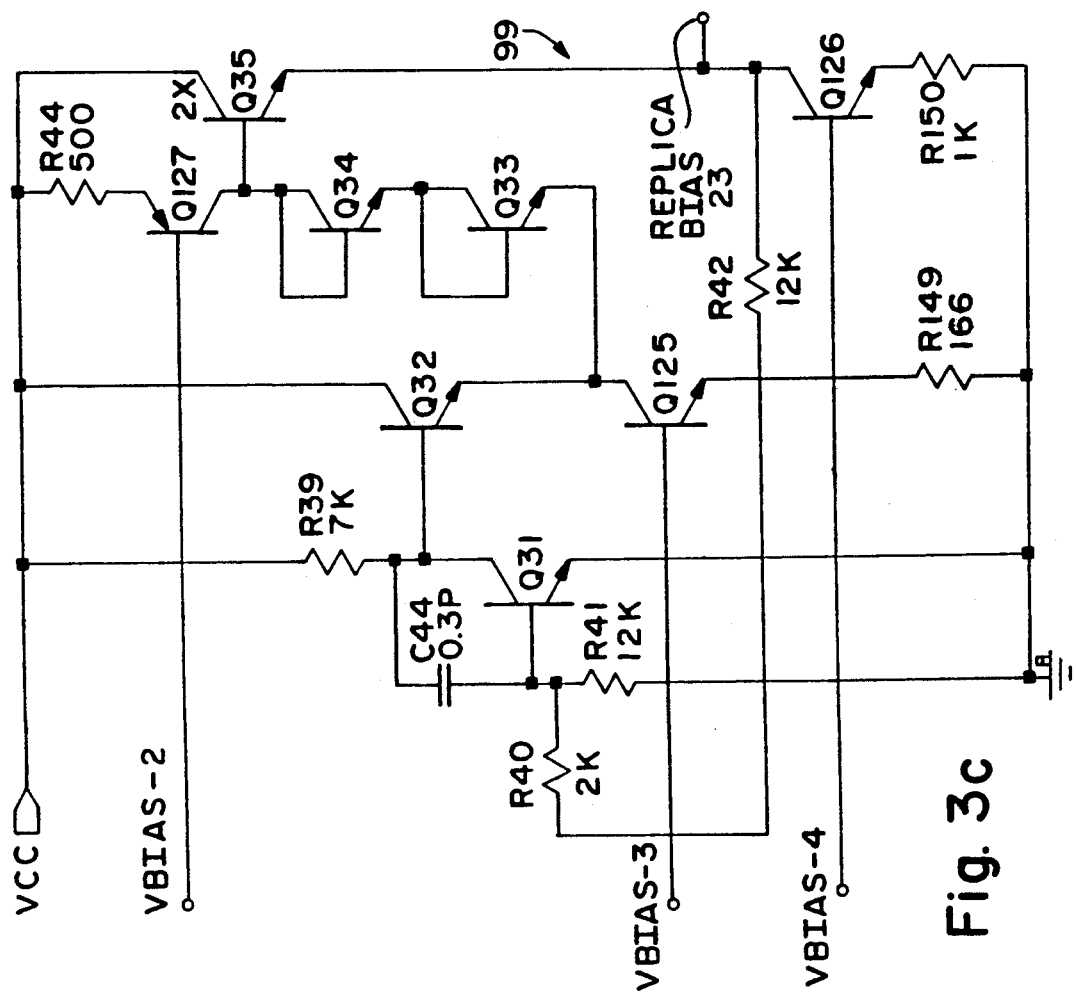
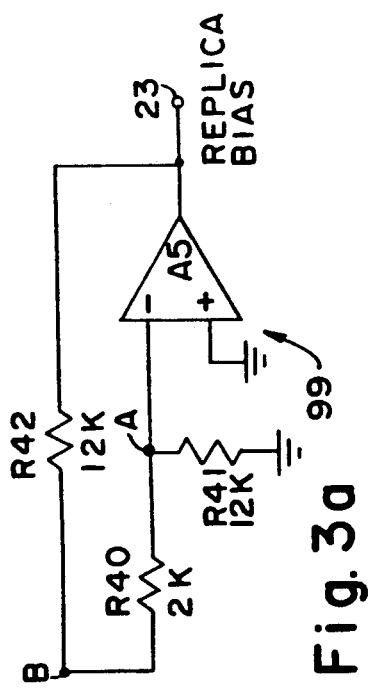
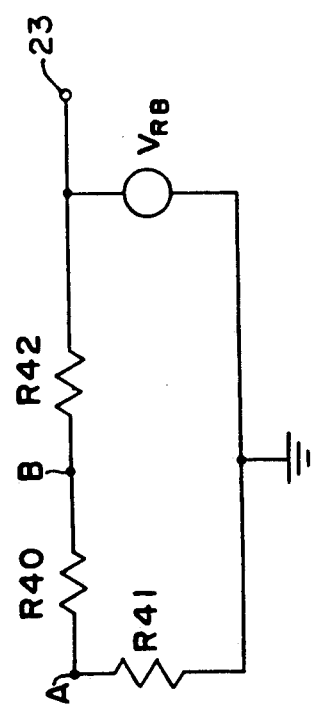

5,107,224

WIDEBAND SINGLE-ENDED VOLTAGE-TO-CURRENT CONVERTER AND GAIN-CONTROL CIRCUIT

This is a continuation of application Ser. No. 115,136, filed Oct. 30, 1987, now abandoned.

BACKGROUND OF THE INVENTION

This invention relates to video driver circuits and more particularly to voltage-to-current converters for receiving input voltage signals related to a video input signal and control of the video output signal by analog input, contrast, and brightness signals.

Wide bandwidth amplifiers are used to amplify video signals. Such wide-band amplifiers are described, for example, in "A New Wide-Band Amplifier Technique", Barrie Gilbert, IEEE Journal of Solid-State Circuits, Vol. SC-3, pages 353–365, December 1968; "Design Techniques for Monolithic Operational Amplifiers", Robert J. Widlar, IEEE Journal of Solid-State Circuits, Vol. SC-4, No. 4, pages 184–191, August 1969; "Amplifying Devices and Low-Pass Amplifier Design", John Wiley & Sons, 1968; and U.S. Pat. No. 3,849,735.

Of importance, wide bandwidth amplifiers typically require response down to DC, thereby precluding AC coupling. Video standards used throughout the world require video signals to be referenced to ground, thereby requiring the use of wide bandwidth, single ended amplifiers. Unfortunately, the prior art has not provided a wideband, single ended, DC coupled monolithic amplifier suitable for use, for example, with video signals.

Gilbert, particularly with respect to FIG. 8 and the discussion pertaining thereto, describes a circuit fabricated with bipolar transistors which is used for providing an output current which is the product and quotient of three separate input currents. Widlar describes a variety of techniques for use in designing operational amplifiers. U.S. Pat. No. 3,849,735 describes a wideband differential amplifier for converting the difference between two input currents to a voltage. U.S. Pat. Nos. 3,430,155 and 4,061,959 describe techniques for biasing bipolar transistors. "Analysis and Design of Analog Integrated Circuits" (Gray and Meyer, John Wiley & Sons, second edition, 1984) describe the use of feedback in analog amplifiers.

SUMMARY

In accordance with the teachings of this invention, a novel wideband, DC coupled, single-ended voltage-to-current converter and gain control circuit is provided. Of importance, the circuit of this invention is designed to receive an input signal referenced to ground such that for zero input signal, zero output signal is provided. Also of importance, the circuit of this invention provides a linear output current in response to the input voltage. In accordance with the teachings of this invention, a circuit is provided which allows for the input of a signal, typically a wide-band signal, such as a video signal, in any one of a desired number of formats, such as ECL, TTL, or analog. Contrast and brightness signals are also applied as input signals to the circuit, which combines the desired one of the wideband information, constrast, and brightness signals in order to provide a suitable output signal. When the circuit is used as a video circuit, the input data is a video signal, and the output signal is a current suitable for driving a CRT display.

In accordance with the teachings of this invention, a replica bias circuit is used which allows the output signal to be a function of the input signal without offsets introduced by bias currents used throughout the circuit.

BRIEF DESCRIPTION OF THE DRAWINGS

FIG. 2b is a more detailed schematic diagram of the circuit of FIG. 2a;

FIG. 3a is a schematic diagram of one embodiment of a replica bias circuit constructed in accordance with the teachings of this invention;

FIG. 3b is an electrical model of the circuit of FIG. 3a;

FIG. 3c is a more detailed schematic diagram of the circuit of FIG. 3a;

FIG. 4b is a more detailed schematic diagram of the circuit of FIG. 4a.

DETAILED DESCRIPTION

Figure 1:
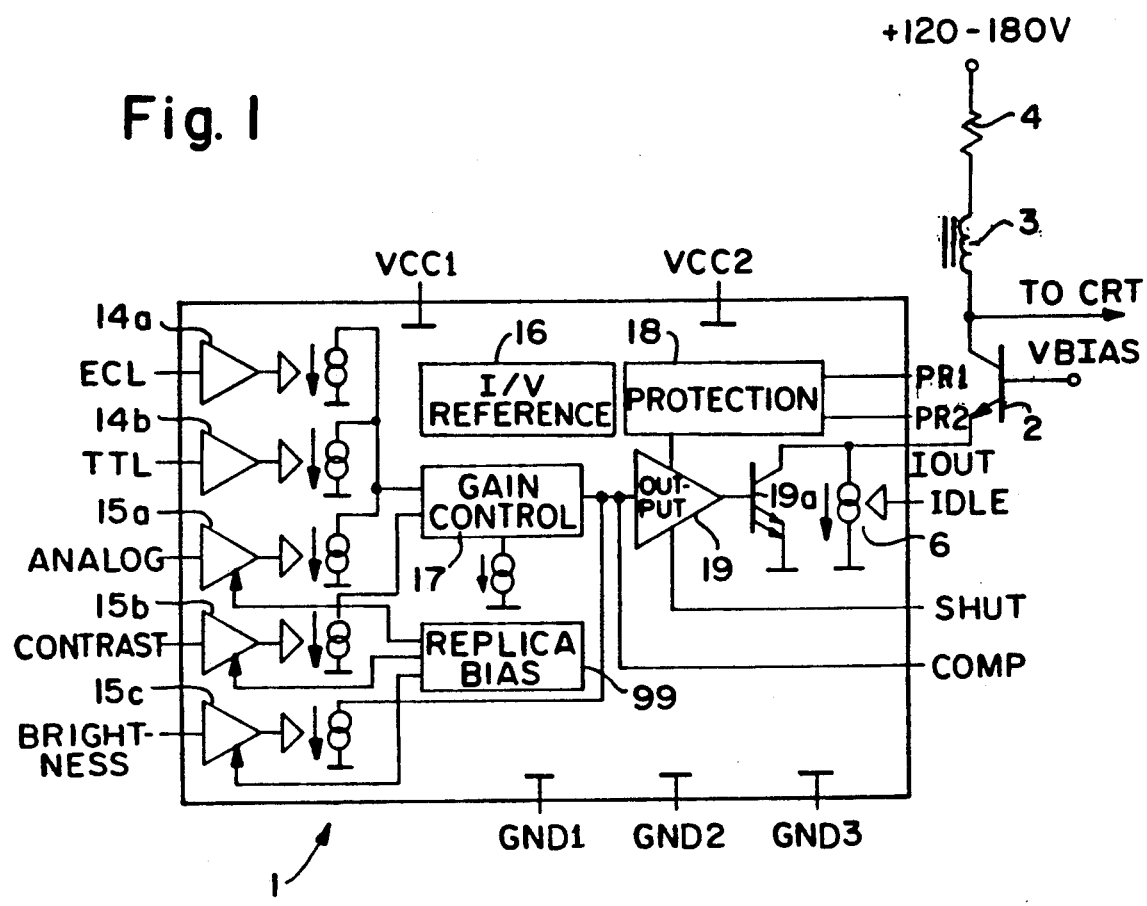
FIG. 1 is a block diagram of one embodiment of a video circuit constructed in accordance with the teachings of this invention.

FIG. 1 is a block diagram of one embodiment of a circuit 1 constructed in accordance with the teachings of this invention which serves as a transconductance amplifier which receives a digital or composite video input signal (with sync removed) and controls a CRT (not shown) via CRT drive transistor 2. However, it is to be understood that this invention is suitable for other applications, for example, in other wide-band applications, or in any application where it is desired to construct an amplifier whose output signal is a function of the input signal without components caused by bias currents used in the amplifier itself.

Referring now to FIG. 1, circuit 1 receives input signals related to a video signal and provides an output signal suitable for driving a CRT display using external power transistor 2 together with inductor 3 and load resistor 4. As shown in FIG. 1, circuit 1 includes input buffer 14a suitable for receiving an ECL signal defining the video pattern to be displayed. Alternatively, the video pattern is provided in TTL format and supplied to input buffer 14b. Alternatively, the video information is an analog signal which is applied to analog video input buffer 15a. Circuit 1 also includes input buffers 15b and 15c for receiving contrast and brightness information, respectively. Any suitable ECL input buffer may be used for buffer 14a, such as those well known in the prior art. Similarly, any suitable TTL input buffer can be used for input buffer 14b, such as those well known in the prior art.

Buffers 15a through 15c may advantageously be constructed in accordance with the teachings of this invention to provide wideband transconductance amplifiers, particularly having a minimum −3 dB bandwidth of approximately 200 MHz, and are described in more detail later. The output current of brightness amplifier 15c provides a fixed DC current offset which is applied to the input lead of output amplifier 19. The output current of one of ECL input buffer 14a, TTL input buffer 14b, or analog input buffer 15a is selected as the video input signal to gain control circuit 17. The current from contrast input amplifier 15b is also provided to an input lead of gain control circuit 17, and varies the gain of gain control circuit 17 linearly from 0 to 120 mA/V, for an input contrast signal of 0 to 3 volts. Output stage 19 is a biasing amplifier with current feedback which linearizes the output signal and makes circuit 1 independent of the current gain (beta) of external output transistor 2.

Circuit 1 also includes I/V reference 16 which serves to provide voltage and current reference levels for use throughout circuit 1. Biasing circuits of this nature are well known in the art, and are described, for example, in the previously referenced text by Gray and Meyer, and in U.S. Pat. Nos. 3,430,155 and 4,061,959. Of course, any suitable current and voltage reference level circuits can be utilized to form I/V reference 16.

Circuit 1 also includes gain control circuit 17 which serves to receive the analog information in the form of a current from a selected one of analog input buffers 14a, 14b, or 15a, in response to the ECL, TTL, or analog input signal or voltages, respectively. Gain control circuit 17 multiplies the analog input current by the current provided by contrast amplifier 15b, such that $$I_{drive} = \frac{I_{analog} \cdot I_{contrast}}{I_{ref}} \text{ ; where} \qquad (1)$$

$I_{drive}$ = the output drive current from gain control circuit 17 which is applied to output amplifier 19;
$I_{analog}$ = the output current from analog input amplifier 15a;
$I_{contrast}$ = the output current from contrast input amplifier 15b; and
$I_{ref}$ = a constant reference current which establishes the gain of gain control circuit 17.

Naturally, the output current $I_{ECL}$ from ECL input amplifier 14a or the output current $I_{TTL}$ from TTL input amplifier 14b can be used in place of $I_{analog}$, depending on the type of input information provided. When one source of video information is selected, the input leads of the others are grounded. If not, undesired input signals will be combined with the desired video information and may saturate gain control circuit 17.

In turn, gain control circuit 17 provides output current $I_{drive}$ to the input lead of output amplifier 19, which current is summed with the output current from brightness amplifier 15c. Output amplifier 19 amplifies this summed current to provide an amplified current to drive power transistor 19a, which in turn provides an output current IOUT to the emitter of power transistor 2. It has been found that it is convenient to form power transistor 19a within the same integrated circuit containing those components located within the box in FIG. 1, while forming power transistor 2, inductor 3, and resistor 4 as components external to the integrated circuit. The intensity of the beam of electrons appearing on the CRT screen (not shown) is controlled by the voltage on the collector of transistor 2, which is applied to the CRT. This voltage is determined by current IOUT, the values of inductor 3 and resistor 4, and the input capacitance of the CRT. As is understood by those of ordinary skill in the art, in a black and white video system, a single circuit 1 is used; however, in a color video system three such circuits are used.

One amplifier which might be used as gain control circuit 17 is shown in the above referenced article by Gilbert. This prior art circuit provides an output current which is the product of two input currents, divided by a third input current. Unfortunately, this prior art circuit has a serious disadvantage in that for a 20 to 1 variation of input currents to be multiplied, the base currents of the multiplying transistors cannot be compensated at high frequency. Furthermore, the AC impedance seen by the bases of the transistors which receive the input currents to be multiplied degrades high frequency linearity.

Circuit 1 also receives an IDLE input signal which controls an IDLE current source 6 which provides a minimum DC current value (typically approximately 1.8 mA) for IOUT, thereby preventing power transistor 2 from turning off, thereby eliminating turn-on delay of power transistor 2.

Circuit 1 also receives a SHUT signal which is applied to disable amplifier 19, in essence to blank the CRT screen. With amplifier 19 disabled by the SHUT signal, IDLE current source 6 provides the minimum DC current for IOUT, but insufficient current to light the CRT screen.

Circuit 1 also includes a COMP lead which allows a compensation capacitor to be connected between the input lead of output amplifier 19 and ground in order to reduce the bandwidth of output amplifier 19, if desired. For example, in one embodiment, connecting a capacitance of approximately 100 pF between the COMP lead and ground provides a −3 dB bandwidth of approximately 30 MHz. Output amplifier 19 may be constructed, for example, as taught in the previously described reference by Gray and Meyer.

Circuit 1 also includes protection subcircuit 18 including leads PR1 and PR2 which allow resistors to be connected between leads PR1 or PR2 and ground, thereby setting a maximum output current limit from output amplifier 19, which limits the maximum level of current IOUT. Circuits suitable for use as protection circuit 18 are known in the prior art and are taught, for example, in the previously described reference by Gray and Meyer.

Figure 2A:
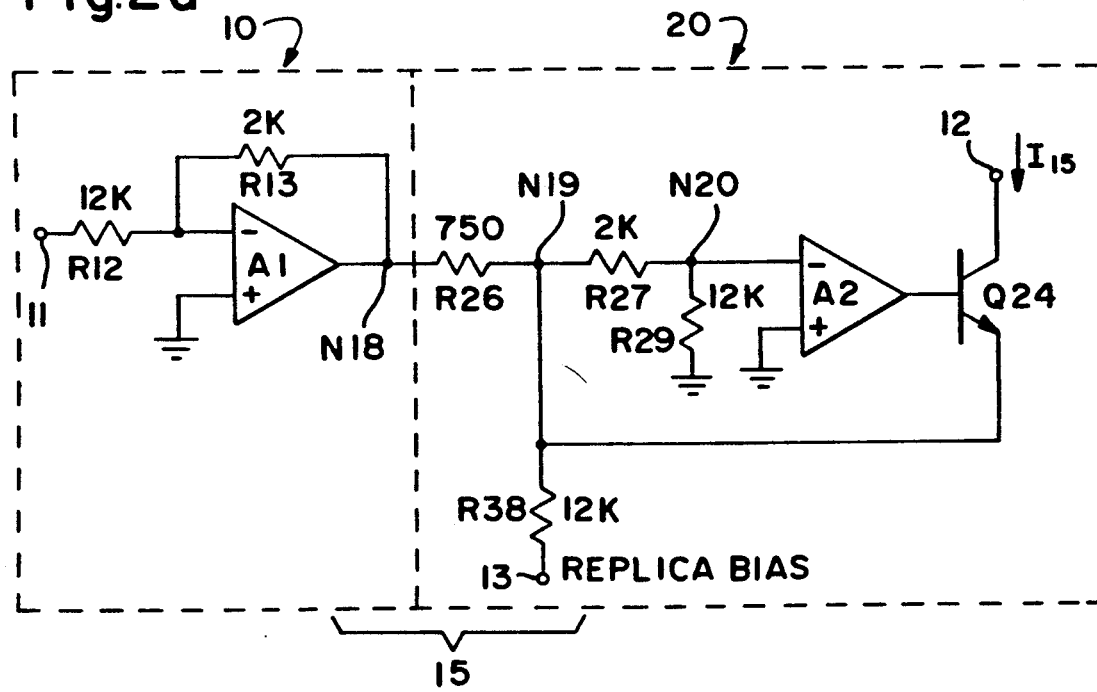
FIG. 2a is a schematic diagram of one embodiment of an amplifier suitable for use as the analog, contrast, and brightness amplifiers of FIG. 1.

FIG. 2a shows a schematic diagram of one embodiment of voltage-to-current converter 15 constructed in accordance with the teachings of this invention suitable for use as input amplifiers 15a, 15b, or 15c of FIG. 1. Voltage-to-current converter 15 includes two subsections, inverting amplifier 10 and unity gain buffer 20. Inverting amplifier 10 receives an input signal on terminal 11 (which is, for example, the ANALOG video input signal applied to input buffer 15a, or the CONTRAST input signal applied to input buffer 15b, or the BRIGHTNESS input signal applied to input buffer 15c of FIG. 1). Amplifier A1 in conjunction with resistors R12 and R13 provide a gain of approximately −1/6, with a DC bias of 7/6 $V_{be}$ (Q11), where Q11 is the inverting input transistor (FIG. 2b) of amplifier A1. Naturally, any desired gain, as determined by the ratio of resistance of resistors R12 and R13, and any DC bias, can be used in accordance with the teachings of this invention. Summing the currents to the inverting input lead of amplifier A1, $$\frac{V_{in} - V_{be}(Q11)}{R_{12}} = \frac{V_{be}(Q11) - V_{N18}}{R_{13}} \text{ ; where} \qquad (2)$$

$V_{N18}$ = the voltage on output node N18 of amplifier A1;

$V_{be}(Q11)$ = the base-emitter voltage of inverting input transistor Q11 (FIG. 2b) of amplifier A1;
$V_{in}$ = the input voltage on input terminal 11;
$R_{12}$ = resistance of R12 = 12K; and
$R_{13}$ = resistance of R13 = 2K.
Then $$V_{N18} = \left(\frac{R_{13}}{R_{12} + R_{13}}\right) V_{be}(Q11) - \left(\frac{R_{13}}{R_{12}}\right) V_{in}; \text{ where}$$

$$\left(\frac{R_{13}}{R_{12} + R_{13}}\right) V_{be}(Q11) = \text{the DC bias; and}$$

$$\left(\frac{R_{13}}{R_{12}}\right) = \text{the gain.}$$

For the resistance values given in the above example, $$V_{N18} = \frac{7}{6} V_{be}(Q11) - \frac{V_{in}}{6} \quad (3)$$

The output signal from amplifier A1 is applied to input resistor R26 of unity gain buffer 20. Unity gain buffer 20 includes amplifier A2 and resistors R26, R27, R29, and output transistor Q24, in order to provide output current I15 available at terminal 12 in response to the input voltage received from inverting amplifier 10. Resistors R27 and R29 are selected to provide a voltage divider having a ratio of 6/7 in order to complement the 1/6 voltage ratio provided by inverting amplifier 10.

Unity gain buffer 20 also includes resistor R38 (which in one embodiment has a value of 12K ohms) connected between the emitter of output transistor Q24 and terminal 13. Terminal 13 receives a replica bias voltage in order to DC bias input node N19, which in turn biases the base of transistor Q24 to the voltage at node N19 plus $V_{be}$.

Summing the currents into node N19:

$$\frac{V_{N18} - V_{N19}}{R_{26}} + \frac{V_{N20} - V_{N19}}{R_{27}} + \frac{V_{RB} - V_{N19}}{R_{38}} + I_{15} = 0; \text{ where} \quad (4)$$

$V_{N18}$ = the voltage on node 18;
$V_{N19}$ = the voltage on node 19;
$V_{N20}$ = the voltage on node 20;
$V_{RB}$ = the replica bias voltage on terminal 13;
$R_{26}$ = the resistance of $R_{26}$ = 750Ω
$R_{27}$ = the resistance of $R_{27}$ = 2KΩ; and
$R_{38}$ = the resistance of $R_{38}$ = 12KΩ.
But the replica bias voltage is carefully selected to be $$V_{RB} = \frac{7}{6} V_{be} + V_{be} \quad (5)$$

where $V_{be}$ is the base-emitter voltage of the input transistor of the amplifier whose dc bias is to be replicated.

By carefully designing and constructing the replica bias circuitry, which is more fully described later, it can be provided that the voltage drop across R38 is equal to $V_{be}$. This is accomplished by providing in the replica bias circuit circuitry which also provides a $V_{be}$ voltage drop across a resistor having equal resistance to resistor R38. In this event, $$V_{N19} = \frac{7}{6} V_{be}(Q11); \text{ where} \quad (6)$$

$V_{N20}$ = the base-emitter voltage of input transistor Q23 (FIG. 2b) of amplifier A2; and
$V_{be}(Q23) = V_{be}(Q11)$, since transistors Q23 and Q11 are matched.

Thus, by combining equations (4), (2), and (6)

$$\frac{\frac{7V_{be}(Q11)}{6} - \frac{V_{in}}{6} - \frac{7V_{be}(Q11)}{6}}{R_{26}} + \quad (7)$$

$$\frac{V_{be}(Q11) - \frac{7V_{be}(Q11)}{6}}{2K} +$$

$$\frac{\frac{7V_{be}(Q11)}{6} + V_{be}(Q11) - \frac{7V_{be}(Q11)}{6}}{12K} + I_{15} = 0$$

which reduces to $$\frac{-V_{in}}{6 \cdot R_{26}} - \frac{V_{be}(Q11)}{6 \cdot 2K} + \frac{V_{be}(Q11)}{12K} + I_{15} = 0$$

and thus $$I_{15} = \frac{V_{in}}{6 \cdot R_{26}}$$

For $R_{26} = 750Ω$, and a maximum $V_{in}$ of 3.0 volts, $I_{15}(\max) \approx 667$ μA.

Accordingly, it is seen that, in accordance with the teachings of this invention, a novel, single ended, DC coupled amplifier is provided which is capable of providing an output current $I_{15}$ which is directly related to the input voltage $V_{in}$, without any effect of the bias voltage used in the circuit.

Figure 2B:
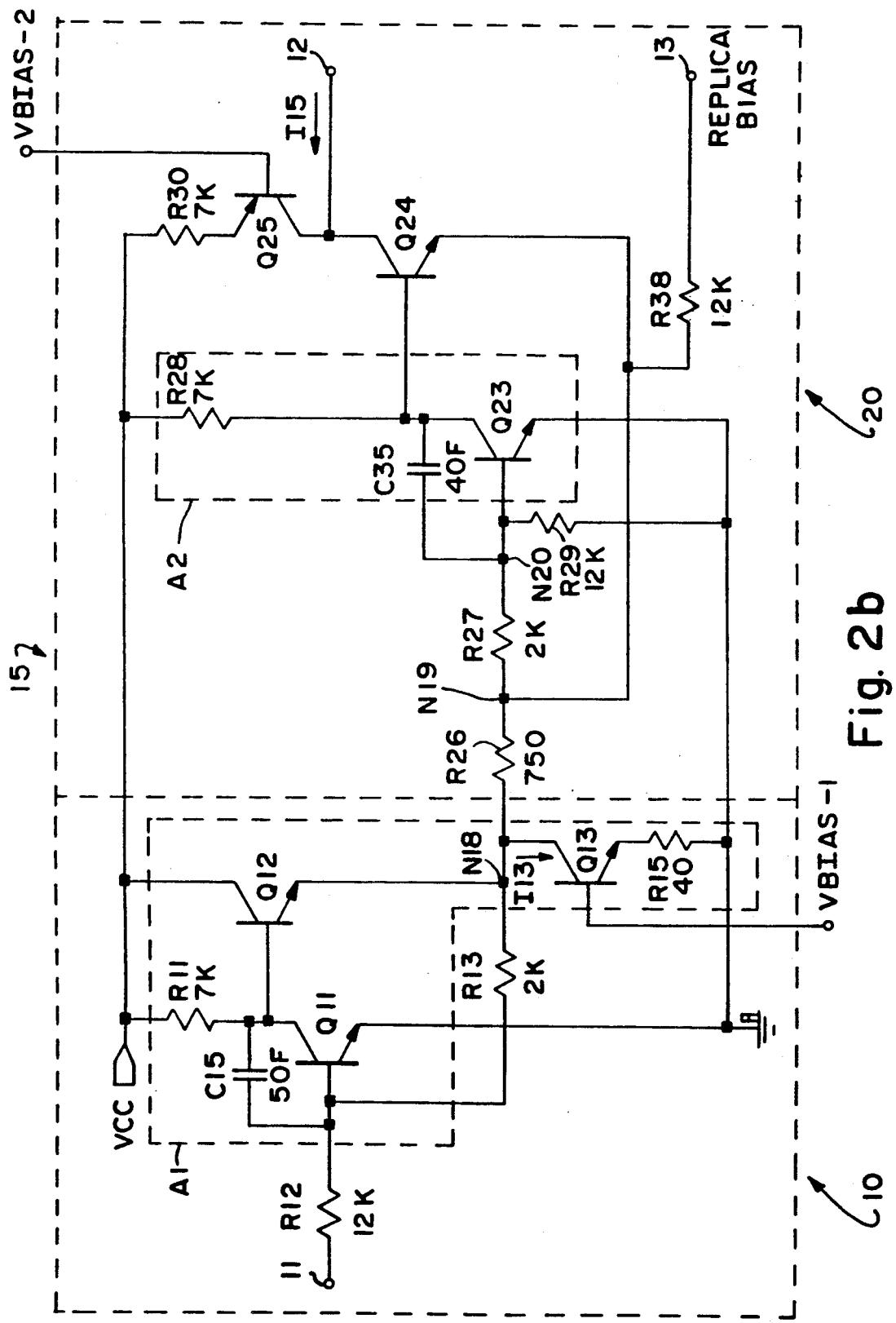

FIG. 2b is a more detailed schematic diagram of one embodiment of the circuit of FIG. 2a. As shown in the embodiment of FIG. 2b, amplifier A1 is a single-sided first amplifier stage and includes current source transistor Q13 and emitter degeneration resistor R15. Transistor Q13 receives a constant DC bias voltage VBIAS-1 from I/V reference circuit 16 (FIG. 1), as is well known to those of ordinary skill in the art, in order to properly bias transistor Q13 to provide a constant collector current I13.

Also shown in FIG. 2b is transistor Q25 which is provided as a current source having its collector connected to output node 12, and its emitter connected to emitter degeneration resistor R30. The base of PNP transistor Q25 is biased by an external bias voltage VBIAS-2, which is provided by I/V reference block 16 of FIG. 1 in order to properly bias transistor Q25 to provide a constant current. Thus, when transistor Q24 is conducting, the current provided by transistor Q25 is consumed by transistor Q24, and transistor Q24 also sinks current I15 from terminal 12. Conversely, with transistor Q24 turned off, the current supplied by current source transistor Q25 serves as a $-I_{15}$ current available on terminal 12. Due to the construction of the embodiment of FIG. 2b, terminal 12 can drive external circuitry (not shown) having voltage levels greater than or equal to about 2 $V_{be}$ without causing transistor Q24 to saturate. In order to allow for this, VBIAS-2 is selected to be approximately 1 volt below VCC. Thus, the embodiment of FIG. 2b is well suited to a wide range of application, since it is quite easy to construct external circuitry having appropriate voltage levels for connection to terminal 12.

FIG. 3a is a schematic diagram of one embodiment of a replica bias circuit 99 constructed in accordance with the teachings of this invention. Replica bias circuit 99 includes amplifier A5, and biasing and feedback resistors R40, R41, and R42 Resistors R40, R41 and R42 form a resistor network across which the replica bias voltage is applied. Replica bias circuit 99 provides a replica bias voltage $V_{RB}$ available on output terminal 23:

$$V_{RB} = \frac{7}{6} V_{be} + V_{be}. \tag{8}$$

FIG. 3b is a model of the circuit of FIG. 3a. Summing the voltages in the replica bias circuit of FIG. 3b:

$$\frac{V_A - V_B}{R_{40}} = \frac{V_B - V_{RB}}{R_{42}}; \text{ where} \tag{9}$$

$V_A$ = The voltage of node A;
$V_B$ = The voltage of node B;
$R_{40}$ = The resistance of resistor $R_{40}$ = 2K;
$R_{42}$ = The resistance of resistor $R_{42}$ = 12K; and
$V_{RB}$ = The replica bias voltage.

Since $V_A$ is the voltage on the inverting input lead of amplifier A5, $V_A = V_{be}(Q31)$, the base-emitter voltage of inverting input transistor Q31 (FIG. 3c) of amplifier A5; and $V_{be}(Q31) = V_{be}(Q11)$, since transistors Q31 and Q11 are matched.

Since the current flowing through resistor R41 (12K) also flows through resistor R40 (2K), $$V_B = \frac{7}{6} V_A \tag{10}$$

Then $$\frac{V_{be} - \frac{7}{6} V_{be}}{2K} = \frac{\frac{7}{6} V_{be} - V_{RB}}{12K} \tag{11}$$

$$V_{be} - \frac{7}{6} V_{be} = \frac{\frac{7}{6} V_{be} - V_{RB}}{6}$$

$$6V_{be} - 7V_{be} = \frac{7}{6} V_{be} - V_{RB}$$

$$V_{RB} = V_{be} + \frac{7}{6} V_{be}$$

FIG. 3c is a more detailed schematic diagram of one embodiment of a replica bias circuit 99 suitable for use in accordance with the teachings of this invention. Replica bias circuit 99 serves to provide a replica bias output voltage on terminal 23 for use in DC biasing node N19 of unity gain buffer 20 of FIG. 2a, which serves as a portion of the analog, contrast, and brightness input buffers 15a, 15b, and 15c, respectively, of FIG. 1. Replica bias circuit 99 uses the bias voltage levels VBIAS-2, VBIAS-3 and VBIAS-4 from I/V Reference 16 (FIG. 1). Conveniently, these bias voltages are also used by the embodiment of amplifier 15 of FIG. 2b, and the embodiment of gain control circuit 17 of FIG. 4b, although any source of suitable bias voltages can be used for each of those circuits. It is not important that they are biased from the same levels.

Referring to FIG. 3c, VBIAS-2, VBIAS-3, and VBIAS-4 are derived in a well known manner from I/V reference 16 of FIG. 1. VBIAS-2 is typically approximately VCC - 1 volt, and serves to bias PNP transistor Q127. VBIAS-3 and VBIAS-4 are approximately equal and serve to bias NPN transistors Q125 and Q126, respectively. Replica bias circuit 99 provides a replica bias signal on output terminal 23 which serves to bias analog amplifier 15a, contrast amplifier 15b, and brightness amplifier 15c. Replica bias serves to cause the biasing, and thus the gain, of analog amplifier 15a, contrast amplifier 15b, and brightness amplifier 15c to track in response to any changes in $V_{be}$ due to, for example, VCC, temperature, temperature gradients, and process variations since each of the analog, contrast and brightness amplifiers derive DC bias for their node 19 from the replica bias voltage available on terminal 23. Since, in this embodiment, three separate input amplifiers 15a, 15b, and 15c are receiving the same replica bias voltage in order to remove the effects on their transfer function due to bias voltages, input transistors Q11 and Q23 (amplifier 15 of FIG. 2b) and transistor Q31 (amplifier A3 of the replica bias circuitry of FIG. 3c) are very closely matched. Of importance, it is not necessary that each input amplifier, 15a, 15b, 15c (FIG. 1) receives a replica bias voltage from the same source, as it is not particularly important that input amplifiers 15a, 15b, and 15c track each other. What is important is that a given replica bias signal properly track changes in $V_{be}$ for a particular amplifier or amplifiers which are being influenced by that replica bias signal.

Figure 4A:
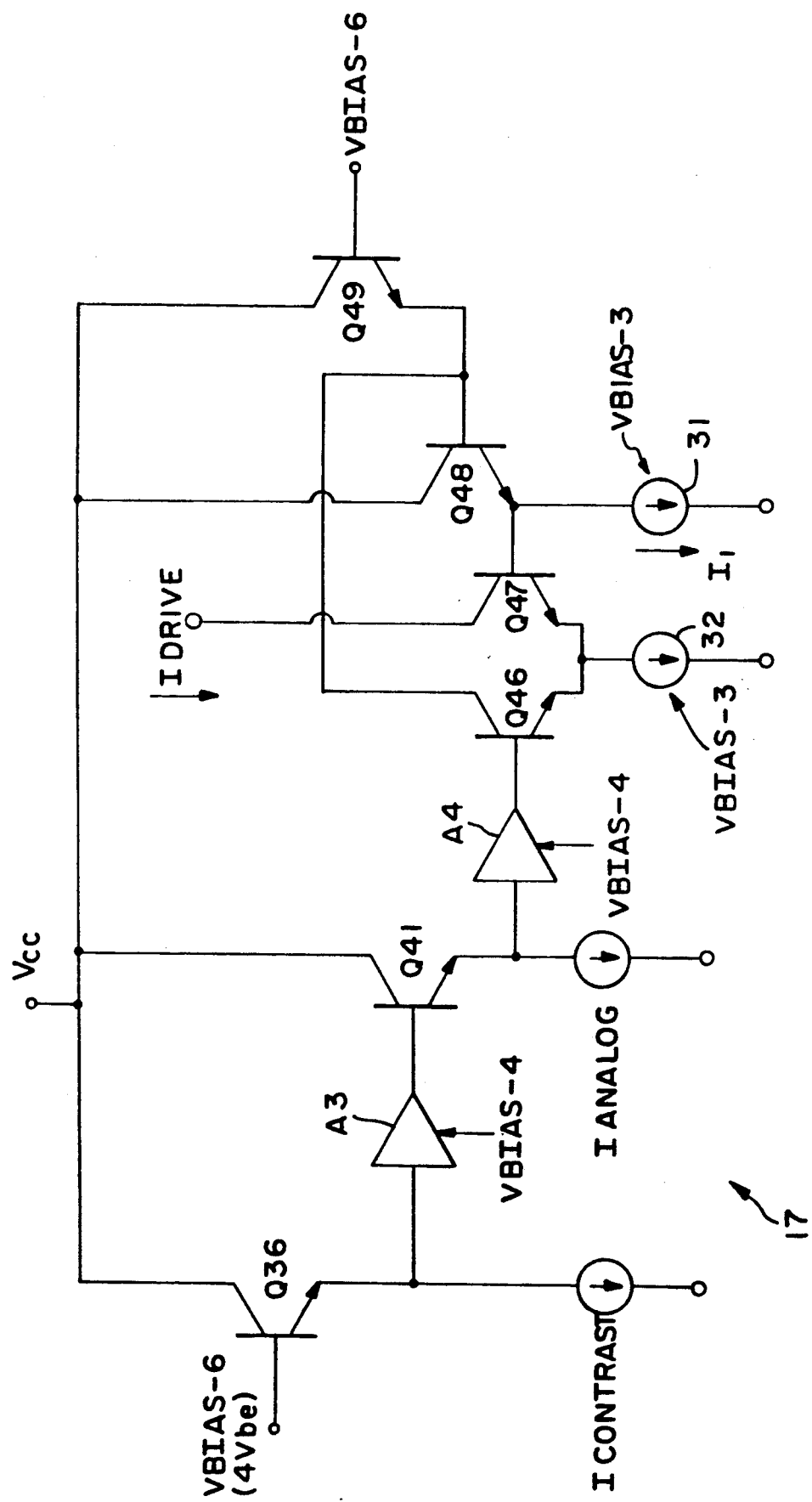
FIG. 4a is a schematic diagram of one embodiment of gain control circuit 17 of FIG. 1.

FIG. 4a is a schematic diagram of one embodiment of gain control circuit 17 (FIG. 1) which functions as a current multiplier. As shown in FIG. 4a, $I_{contrast}$ and $I_{analog}$ (from contrast and analog amplifiers 15b and 15a, of FIG. 1) serve as input currents to gain control circuit 17. Transistor Q36 receives on its base bias voltage VBIAS-6 (typically approximately 4 $V_{be}$*) in order to provide a desired DC bias on the input lead of unity gain buffer A3. Therefore, the output voltage on the output lead of unity gain buffer A3 is provided in response to the voltage appearing on the input lead of unity gain buffer A3, as determined by the bias set by transistor Q36 and the $I_{contrast}$ current. The input voltage on the input lead of unity gain buffer A3 is equal to \* where $V_{be}$ here represents the standard base-emitter voltage of a forward biased bipolar transistor.

$$V_{IN}(A3) = (VBIAS-6) - V_{be}(Q36) \tag{12}$$

But, since for each transistor Qx, $$V_{be}(Qx) = VT \ln(I_C(Qx)/I_S(Qx)) \tag{13}$$

where $I_C(Qx)$ = the collector current of transistor Qx;
$I_S(Qx)$ = the saturation current of transistor Qx;

$$V_T = kT/q; \tag{14}$$

k = Boltzman's constant;
T = temperature in degrees Kelvin; and
q = the charge of an electron.
Combining equations (12) and (13), $$V_{IN}(A3) = 4V_{be} - V_T \ln(I_{contrast}/I_S(Q36)) \tag{15}$$

Transistor Q41 operates in a similar fashion as transistor Q36, except that its base voltage is provided by the output lead of unity gain buffer A3 in response to $V_{IN}$-

(A3). The voltage on the input lead of unity gain buffer A4 is equal to $$V_{IN}(A4) = V_{OUT}(A3) - V_{be}(Q41) \qquad (16)$$

but for a unity gain buffer, $$V_{OUT}(A3) = V_{IN}(A3) \qquad (17)$$

and $$V_{OUT}(A4) = V_{IN}(A4) \qquad (18)$$

so $$V_{IN}(A4) = V_{IN}(A3) - V_T \ln(I_{analog}/I_S(Q41)) \qquad (19)$$

Combining equations (19), (18), and (15), $$V_{OUT}(A4) = 4V_{be} - V_T \ln(I_{contrast}/I_S(Q36)) - V_T \ln(I_{analog}/I_S(Q41)) \qquad (20)$$

Thus, output voltage $V_{OUT}(A4)$ on the output lead of unity gain buffer A4 is a function of both $I_{contrast}$ and $I_{analog}$.

Transistor Q49 receives its base drive from VBIAS-6 ($4V_{be}$), and is biased by the collector of transistor Q46. The emitters of transistors Q46 and Q47 are connected to current source 32 controlled by VBIAS-3. VBIAS-3 is also conveniently used to control current source 31 which provides current $I_1$ to the emitter of transistor Q48, which in turn drives the base of transistor Q47. Summing the voltage drops between the bases of transistors Q36 and Q49, which are both at the same voltage level VBIAS-6, and keeping in mind that amplifiers A3 and A4 are unity gain amplifiers (equations 17 and 18), $$V_{be}(Q36) + V_{be}(Q41) + V_{be}(Q46) - V_{be}(Q47) - V_{be}(Q48) - V_{be}(Q49) = 0 \qquad (21)$$

Using equation (13), $$V_T[\ln(I_C(Q36)/I_S(Q36)) + \ln(I_C(Q41)/I_S(Q41)) + \ln(I_C(Q46)/I_S(Q46)) - \ln(I_C(Q47)/I_S(Q47)) - \ln(I_C(Q48)/I_S(Q48)) - \ln(I_C(Q49)/I_S(Q49))] = 0.$$

and thus $$\ln \frac{(I_C(Q36)/I_S(Q36))(I_C(Q41)/I_S(Q41))(I_C(Q46)/I_S(Q46))}{(I_C(Q47)/I_S(Q47))(I_C(Q48)/I_S(Q48))(I_C(Q49)/I_S(Q49))} = 0$$

Taking antilogarithms, $$\frac{(I_C(Q36)/I_S(Q36))(I_C(Q41)/I_S(Q41))(I_C/I_S(Q46))}{(I_C(Q47)/I_S(Q47))(I_C(Q48)/I_S(Q48))(I_C/I_S(Q49))} = 1 \qquad (22)$$

From FIG. 4a, we see $$I_C(Q36) = I_{contrast}$$

$$I_C(Q41) = I_{analog}$$

$$I_C(Q46) = I_C(Q49)$$

$$I_C(Q47) = I_{drive}$$

$$I_C(Q48) = I_1.$$

Thus $$\frac{(I_{contrast}/I_S(Q36))(I_{analog}/I_S(Q41))(1/I_S(Q46))}{(I_{drive}/I_S(Q47))(I_1/I_S(Q48))(1/I_S(Q49))} = 1 \qquad (23)$$

Thus, transistor Q47 provides on its collector an output current $I_{drive}$ in response to the output voltage on the output lead of unity gain buffer A4:

$$I_{drive} = \frac{I_{analog} \cdot I_{contrast}}{I_1} \cdot K; \text{ where} \qquad (24)$$

$I_{drive}$ = the output drive current provided by gain control circuit 17;
$I_1$ = a reference current; and
K = a constant determined by the ratio of transistor saturation currents:

$$K = \frac{(I_S(Q47))(I_S(Q48))(I_S(Q49))}{(I_S(Q36))(I_S(Q41))(I_S(Q46))} \qquad (25)$$

Since the saturation current of a bipolar transistor is proportional to the area of its emitter, $$K \alpha \frac{A(Q47)A(Q48)A(Q49)}{A(Q46)A(Q41)A(Q36)}; \text{ where} \qquad (26)$$

A(Qx) = the emitter area of transistor Qx.
In one embodiment,
A(Q36) = A(Q46) = A(Q47) = A(Q48) = A(Q49) = 10;
A(Q41) = 5; and
$I_1$ = 400 μA.
Then $$I_{drive} = \frac{I_{analog} \cdot I_{contrast}}{200 \mu A} \qquad (27)$$

Thus, for $I_{contrast}$ = 600 μA, $$I_{drive} = 3 I_{analog} \qquad (28)$$

Of importance VBIAS-3 is a highly stable voltage thereby causing $I_{drive}$ to be highly stable with respect to the voltage on output lead of unity gain buffer A4. In order for the transfer function of output amplifier 17 to be a function of only $I_{contrast}$ and $I_{analog}$, VBIAS-3, and thus reference current $I_1$, is made to be highly constant.

Unity gain buffers A3 and A4 serve to maintain the low output impedance normally seen by the base of transistors Q41 and Q46 from emitter followers Q36 and Q41, respectively. In this manner, transistors Q41 and Q46 are always driven by a low source impedance, thereby insuring high frequency linearity.

Figure 4B:
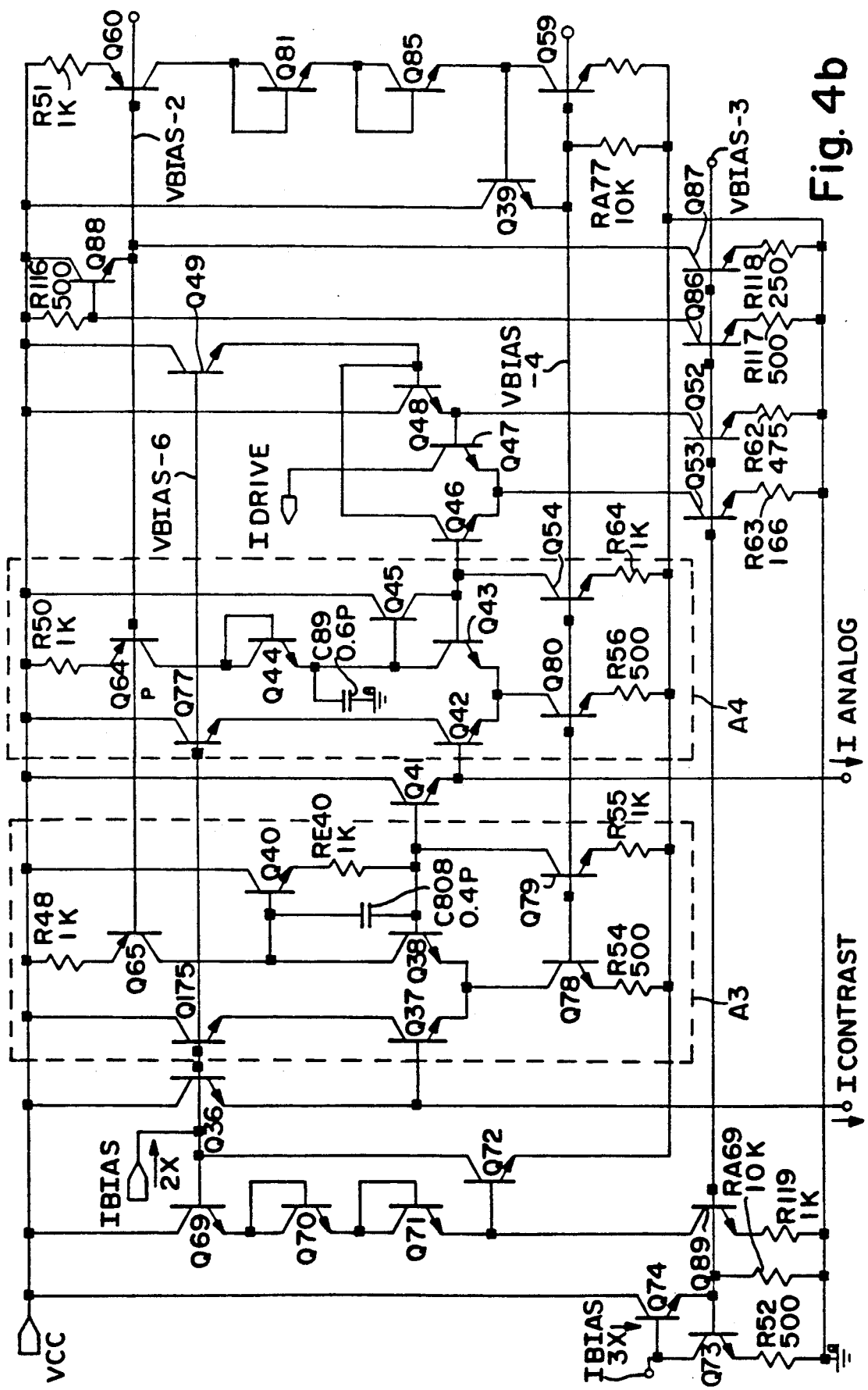

FIG. 4b is a more detailed schematic diagram of one embodiment of gain control circuit 17 shown in FIG. 4a. Amplifiers A3 and A4 are shown in more detail, and their current sources Q78 and Q80 are driven by VBIAS-4. However, current sources Q65 and Q64 are driven by a separate bias voltage VBIAS-2. Of importance, transistors Q65 and Q64 are operated by a bias voltage VBIAS-2, rather than being internally biased within unity gain buffers A3 and A4, respectively. This serves to reduce the amount of current source base drive required to be derived from a particular voltage regulator, and also minimizes high frequency feedback within each amplifier A3 and A4. The VBIAS-6 voltage applied to the bases of transistors Q36, Q175, Q77, and Q49 is set at 4 $V_{be}$ by transistors Q69 through Q72. The base of transistor Q69 is driven by a bias current IBIAS equal to 2 times the reference current of 200 microamps.

VBIAS-3 is provided by transistors Q73 and Q74 which receive a bias current IBIAS equal to 3 times the reference current or approximately 600 microamps. This VBIAS-3 is also used to drive transistor Q89, which is part of the biasing network consisting of transistors Q69 through Q72. VBIAS-3 also drive the bases of transistors Q53 and Q52, which in turn drive the emitters of transistors Q46, Q47 and transistor Q48, respectively, as previously described with regard to FIG. 4a. Transistor Q86 is driven by VBIAS-3 and in turn biases Q88 in order to provide VBIAS-2. VBIAS-2, in turn, biases the base of transistor Q60, which establishes, in conjunction with transistors Q81, Q85, Q39 and Q59, VBIAS-4, as previously described. VBIAS-4 in turn drives the bases of current sources Q78, Q79, Q80 and Q54.

Thus, in accordance with the teachings of this invention, a novel, wide band, DC coupled, single ended voltage-to-current converter is provided which receives a bias voltage from the replica bias circuit, thereby causing the amplifier to have a transfer function independent of the bias levels used in the amplifier.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

I claim:

1. A wideband, DC coupled single-ended amplifier comprising:
   a plurality of input terminals for receiving a respective plurality of input signals each referenced to a fixed potential,
   an output terminal for providing an output signal,
   a plurality of bipolar single-sided first amplifier stages connected respectively to said input terminals, each of said first amplifier stages having a respective base-to-emitter voltage $V_{be}$, and receiving a respective one of said input signals and providing a respective first intermediate signal having a respective first component which is a function of the respective input signal and a respective second component which is a function of a respective bias signal used in that first amplifier stage, said respective bias signal being a function of at least one condition independent of said input signal,
   a replica bias circuit for generating a plurality of tracking signals which are a function of said at least one condition, and amplifying and combining said plurality of tracking signals to provide a single replica bias signal which is related to and tracks a combination of said respective second components,
   means for combining said respective first intermediate signals and said replica bias signal to provide a second intermediate signal which is a function of said plurality of input signals and not a function of said respective bias signals or said replica bias signal, and
   a second amplifier stage having an input lead for receiving said intermediate signal and having an output lead connected to said output terminal for providing said output signal, said output signal being a function of said plurality of input signals and not a function of said respective bias signals or said replica bias signal.

2. A video driver circuit comprising:
   a plurality of input terminals for receiving a respective plurality of input signals referenced to ground, one of said input signals being an analog video signal, and another of said input signals being a DC level,
   an output terminal for providing an output current signal,
   a plurality of bipolar single-sided first amplifier stages connected respectively to said input terminals, each of said first amplifier stages having a respective base-to-emitter voltage $V_{be}$, affected by at least one bias signal, and receiving a respective one of said input signals and providing a respective first intermediate signal having a respective first component which is a function of the respective input signal and a respective second component which is a function of said respective bias signal used in that first amplifier stage, said respective bias signal being a function of at least one condition independent of said input signal,
   a replica bias circuit including a replica bias resistor network for generating a plurality of tracking signals which are a function of said at least one condition, and amplifying and combining said plurality of tracking signals to provide across said resistor network a single replica bias voltage which is related to and tracks a combination of said respective second components,
   means for combining said respective first intermediate signals and said replica bias voltage to provide a second intermediate signal which is a function of said plurality of input signals and not a function of said respective bias signals or said replica bias voltage, and
   a second amplifier stage having an input lead for receiving said intermediate signal and having an output current connected to said output terminal for providing said output signal, said output signal being a function of said plurality of input signals and not a function of said respective bias signals or said replica bias voltage.

* * * * *